United States Patent
Lee et al.

(10) Patent No.: US 7,067,848 B1
(45) Date of Patent: Jun. 27, 2006

(54) HIGH INTENSITY LED

(76) Inventors: Wen-Jen Lee, Floor 5, No. 9, Alley 15, Lane 214, Section 4, Jhongsin Road, Sanchong City, Taipei County (TW); Jyun-Ze Lin, No. 703, Section 2, Sansing Road, Sansing Township, Yilan County (TW)

( * ) Notice: Subject to any disclaimer, the term of this patent is extended or adjusted under 35 U.S.C. 154(b) by 0 days.

(21) Appl. No.: 11/146,024

(22) Filed: Jun. 7, 2005

(30) Foreign Application Priority Data

Mar. 21, 2005 (TW) .............................. 94204340 U

(51) Int. Cl.
*H01L 33/00* (2006.01)
(52) U.S. Cl. .................. 257/99; 257/100; 257/E33.066
(58) Field of Classification Search .................. 257/99, 257/100, 459, 680
See application file for complete search history.

(56) References Cited

U.S. PATENT DOCUMENTS

| | | | |
|---|---|---|---|
| 6,031,253 A | * | 2/2000 | Kobayashi .................... 257/99 |
| 6,531,328 B1 | * | 3/2003 | Chen ........................... 438/26 |
| 6,921,927 B1 | * | 7/2005 | Ng et al. ...................... 257/99 |
| 2006/0022208 A1 | * | 2/2006 | Kim et al. .................... 257/98 |

* cited by examiner

*Primary Examiner*—T. N. Quach
(74) *Attorney, Agent, or Firm*—Bacon & Thomas

(57) ABSTRACT

A High Intensity LED is disclosed to include a metal base, which has a through hole extending between the top and bottom surfaces thereof and a first electrode formed integral with and downwardly extending from the bottom surface, a second electrode inserted through the through hole and isolated from the metal base with an electrically insulative sleeve, an LED chip mounted on the top surface of the metal base and electrically contacting with the top surface of the metal base and the LED chip electrically connected to the top end of the second electrode with at least one gold wire, and an electrically insulative packaging shell surrounding the metal base and the LED chip excluding the first electrode and the bottom end of the second electrode. Red, green and/or blue color LED chips may be in contact with the top surface of the metal base to produce High Intensity light.

4 Claims, 3 Drawing Sheets

FIG. 1(Priart Art)

HIGH INTENSITY LED

BACKGROUND OF THE INVENTION

1. Field of the Invention

The present invention relates to a light emitting diode (LED) and more particularly, to a High Intensity LED.

2. Description of Related Art

A conventional High Intensity LED, i.e. SUPER BRIGHT LED, as shown in FIG. 1, has a LED chip 51 and positive and negative electrodes 53,52 directly enclosed in a shell 50 thereof. When electrically connected, electric current passes through the positive electrode 53 to the LED chip 51 via a gold wire 54, thereby causing the LED chip 51 to give off light. Because the LED chip 51 is enclosed in the packaging shell 50, heat energy thus produced can only be dissipated into the outside air through a pin at the bottom side of the negative electrode 52. Because the pin can only dissipate a small amount of heat energy, this high intensity LED is limited to the use of an LED chip of a size below 0.25×0.5 m/m and current below 70 mA, i.e., this design of high intensity LED does not allow a relatively heavy current, or installation of multiple LED chips therein.

SUMMARY OF THE INVENTION

The present invention has been accomplished under the circumstances in view. According to the present invention, the High Intensity light emitting diode (LED) is comprised of a metal base, a first electrode, a second electrode, an electrically insulative sleeve, at least one light emitting diode (LED) chip, and an electrically insulative packaging shell. The metal base has a top surface, a bottom surface, a through hole extending through the top surface and the bottom surface, and a first electrode formed integral with and downwardly extending from the bottom surface. The second electrode is inserted through the through hole, having a top end suspending above the top surface of the metal base and a bottom end suspending below the bottom surface of the metal base. The electrically insulative sleeve is sleeved onto the second electrode and mounted in the through hole to isolate the second electrode from the metal base. The at least one light emitting diode (LED) chip is mounted on the top surface of said metal base and electrically contacts the top surface of the metal base and at least one LED chip electrically connected to the top end of the second electrode by a gold wire. The electrically insulative packaging shell surrounds the metal base and the at least one light emitting diode (LED) chip excluding the bottom end of the first electrode and the bottom end of the second electrode.

The top surface of the metal base has an area sufficiently large for the bonding of a plurality of LED chips to produce a High Intensity light. Further, because the metal base is good for conduction of electricity and heat energy, it does not produce much impedance when a high current is provided to multiple LED chips at the metal base, and heat can rapidly be dissipated into the outside air during the operation of the LED chips. Because the High Intensity LED dissipates heat efficiently, it has a long service life.

The aforesaid metal base can be directly stamped by a punch machine, and is produced integrally from a copper block, or formed of copper, copper-nickel-silver alloy, or any other conductive metal material by cold forging, roller ramming, casting, etc. The metal base can be made to have a top flange. The top flange can be extended from the top surface of the metal base in vertical. Alternatively, the top flange can be a tapered flange extending upwards from the border of the top surface and sloping upwardly outwards.

The electrically insulative sleeve can be made of glass, bakelite, or any of other suitable electrically insulative materials.

The aforesaid at least one LED chip includes at least one of: white color LED chip, red color LED chip, green color LED chip, and blue color LED chip.

DETAILED DESCRIPTION OF THE PREFERRED EMBODIMENT

Figure 1:
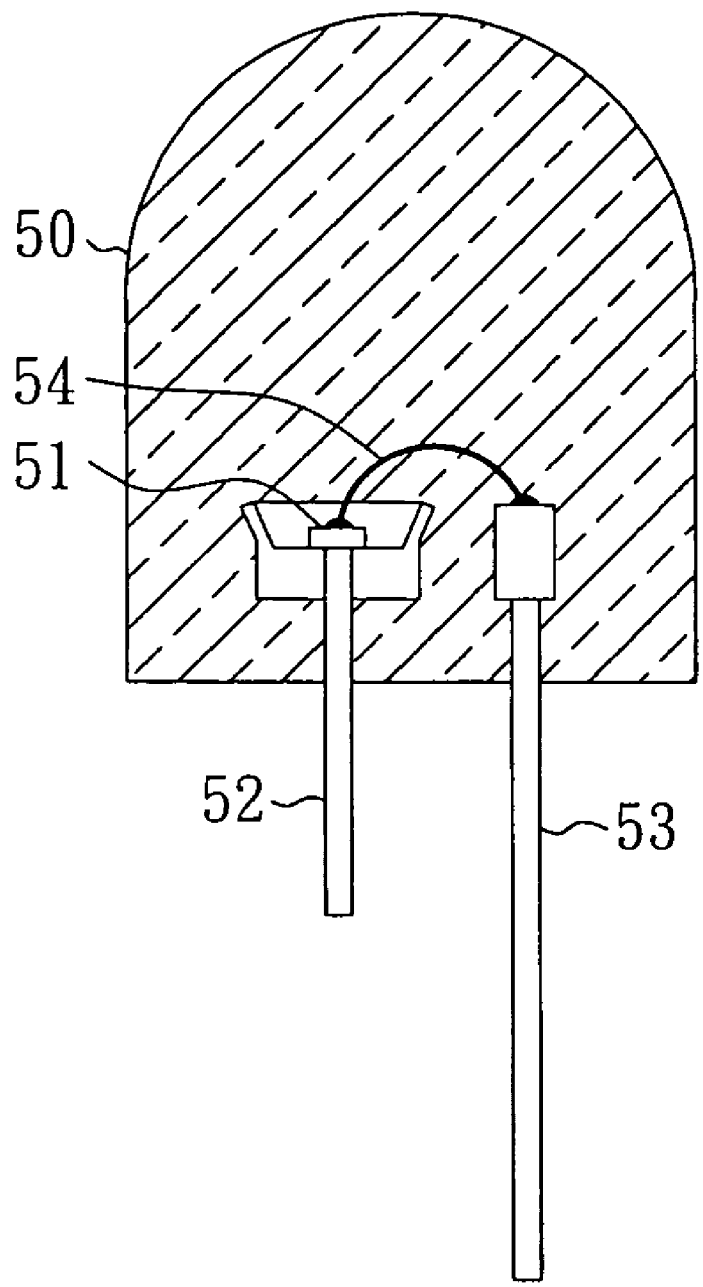
FIG. 1 is a sectional view of a High Intensity LED according to the prior art.
Figure 2:
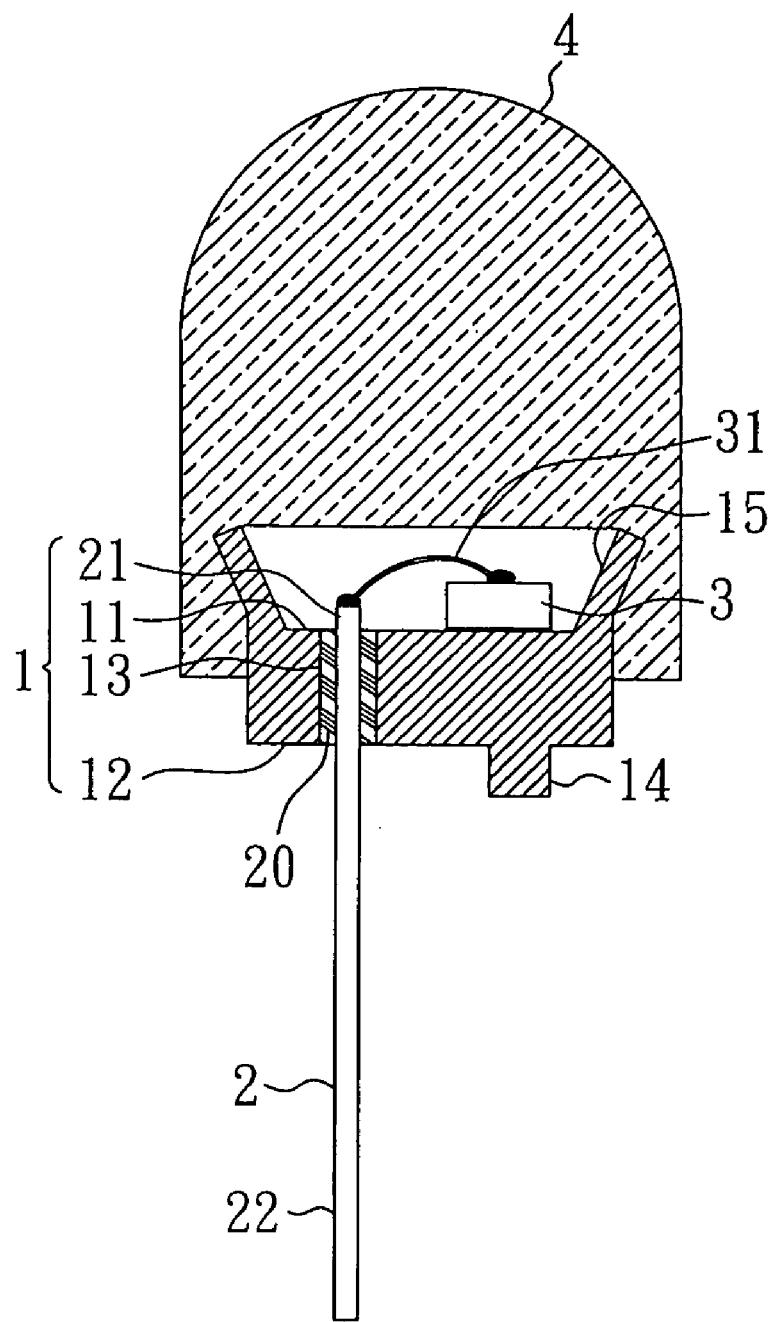
FIG. 2 is a sectional view of a High Intensity LED according to the present invention.

Referring to FIG. 2, a High Intensity LED, in accordance with the present invention is shown comprising a metal base 1, a second electrode 2, an insulative sleeve 20, an LED chip 3, and a packaging shell 4.

As shown in FIG. 2, the metal base 1 is directly stamped and formed integrally from a copper or copper-nickel-silver alloy block subject to a predetermined pattern, the metal base 1 having a top surface 11, a bottom surface 12, a through hole 13, and a first electrode 14. The through hole 13 extends from the top surface 11 to the bottom surface 12. The first electrode 14 is a negative electrode downwardly extending from the bottom surface 12 of the metal base 1. Because the first electrode 14 is formed integral with the bottom surface 12 of the metal base 1, the invention eliminates the application of a welding procedure that may cause a thermal strain or concentration of stress at the welding spot, thereby producing an impedance to conduct electricity and to further release heat. The metal base 1 further has a tapered flange 15 extending around the border of the top surface 11 and sloping upwardly outwards.

The second electrode 2 is a positive electrode formed of a copper rod, having a top end 21 and a bottom end 22. The insulative sleeve 20 is a glass tube sleeved onto the second electrode 2 and mounted on the second electrode 2 in the through hole 13 of the metal base 1.

The LED chip 3 is a monochrome LED chip, for example, white light LED chip, red light LED chip, green light LED chip, or blue light LED chip. Alternatively, two or more LED chips may be installed to produce a color of mixed light. Preferably, conducting glue is used to adhere the LED chip 3 to the top surface 11 of the metal base 1. It is not recommended to fasten the LED chip 3 to the metal base 1 by welding or drilling a mounting hole as that may cause a concentration of stress or production of impedance.

According to this embodiment, the packaging shell 4 surrounds the metal base 1, keeping the LED chip 3, the gold wire 31 and the top end 21 of the second electrode 2 embedded therein. The top end 21 and bottom end 22 of the second electrode 2 respectively protrude over the top surface 11 and bottom surface 12 of the metal base 1. The at least one gold wire 31 is electrically connected between the top end 21 of the second electrode 2 and the LED chip 3.

It is to be noted that at least the first electrode 14 and the bottom end 22 of the second electrode 2 are exposed to the outside of the packaging shell 4 for the connection of external power supply after the High Intensity LED has been well packaged. Preferably, the lower portion of the metal base 1 is exposed to the outside of the packaging shell 4 for quick dissipation of heat. Further, because the tapered flange 15 of the metal base 1 slopes upwardly outwards, it provides a cup that protects the LED chip 3 and provides a reflective face on the inside to enhance the brightness of the light produced by the LED chip 3. Further, the packaging shell 4 also surrounds the tapered flange 15. At this time, the tapered flange 15 works as a barb hooking the packaging shell 4, thus preventing escape of the packaging shell 4 from the metal base 1.

When an external power supply is provided to the second electrode 2 at the positive pole and the first electrode 14 at the negative pole, electric current passes along the gold wire 31 to the LED chip 3, thereby causing the LED chip 3 to give off light. Because the metal base 1 is directly stamped by a punch machine, and is integrally formed from a copper block, it is highly conductive and, its internal impedance is insignificant. Therefore, the metal base 1 does not produce much heat upon exposure to a high current. Further, because the copper material of the metal base 1 has a high conductivity of heat and because the metal base 1 has a part exposed to the outside of the packaging shell 4, the High Intensity LED has an optimum heat dissipation area to dissipate heat efficiently. Therefore, this embodiment allows the use of a high capacity LED chip of size 1.0×1.0 m/m or 2.0×2.0 m/m or current over 1A, or multiple LED chips at the same time, thereby producing High Intensity light.

Figure 3:
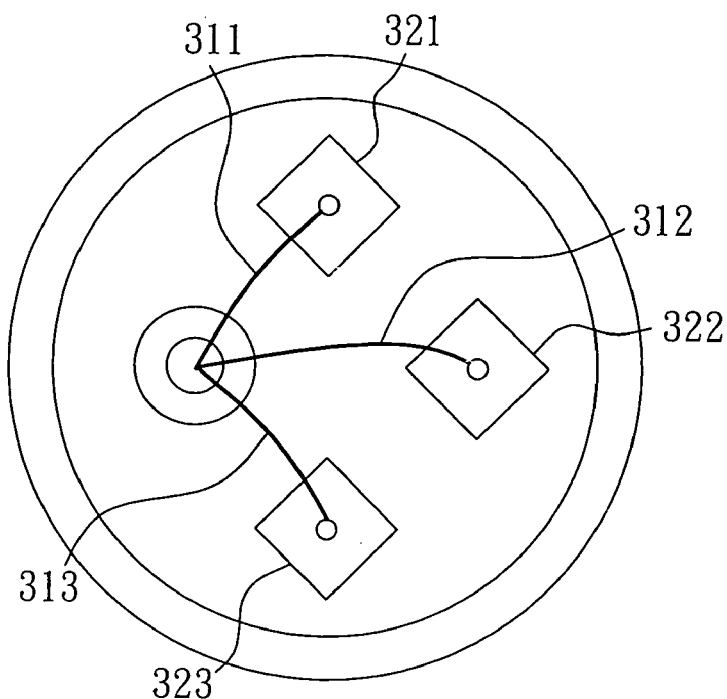
FIG. 3 is a top view of an alternative form of the High Intensity LED according to the present invention.

FIG. 3 is a top view of an alternative form of the High Intensity LED according to the present invention. This embodiment is substantially similar to the embodiment shown in FIG. 2 with the exception that red, green and blue LED chips 321,322,323 are in contact with the top surface of the metal base and respectively connected to the second electrode of the metal base by gold wires 311,312,313. When electrically connected, the High Intensity LED produces three prime colors (RGB) that are mixed into white light.

Figure 4:
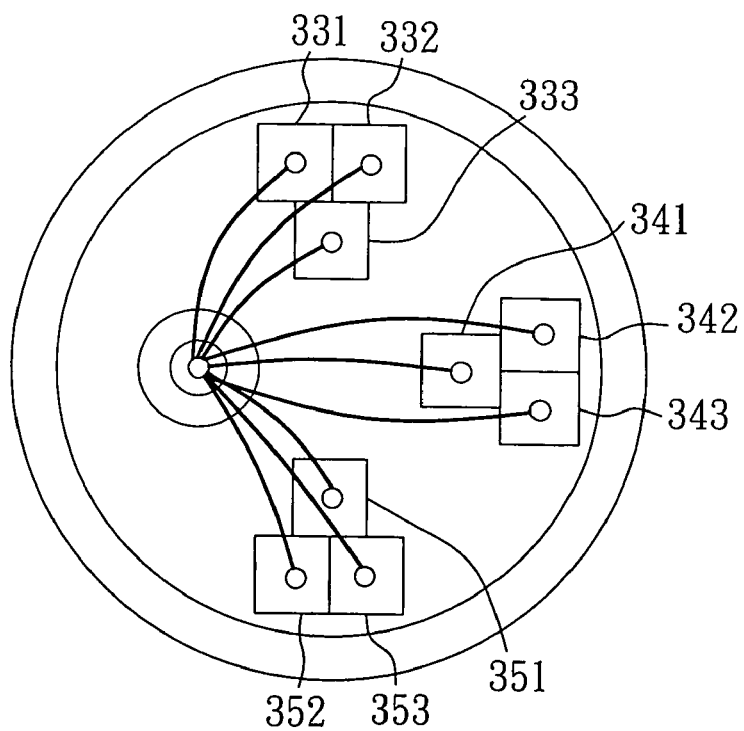
FIG. 4 is a top view of another alternative form of the High Intensity LED according to the present invention.

FIG. 4 is a top view of another alternative form of the High Intensity LED according to the present invention. This embodiment is substantially similar to the aforesaid two embodiments with the exception that 9 pieces of LED chips 331~353 are in contact with the top surface of the metal base and electrically connected to the second electrode of the metal base by gold wires. According to this embodiment, the total 9 pieces of LED chips 331~353 can be selectively turned on subject to the desired brightness. The 9 pieces of LED chips 331~353 can have the same color. Alternatively, the LED chips 33~353 can be arranged in three sets each including a red color LED chip, a green color LED chip, and a blue color LED chip. When the three prime color LED chips of each LED chip set are electrically connected, the three prime colors are mixed, thereby producing white light.

As shown in FIGS. 3 and 4, the top surface of the metal base has an area sufficiently large for the bonding of a plurality of LED chips to produce a high Intensity of light. Further, because the metal base is good for conduction of electricity and heat energy, it does not produce much impedance when a high current is provided to multiple LED chips at the metal base, and heat can rapidly be dissipated into the outside air during the operation of the LED chips. Because the High Intensity LED dissipates heat efficiently, it has a long service life.

Although the present invention has been explained in relation to its preferred embodiments, it is to be understood that many other possible modifications and variations can be made without departing from the spirit and scope of the invention as hereinafter claimed.

What is claimed is:

1. A High Intensity light emitting diode (LED) comprising:
    a metal base, said metal base having a top surface, a bottom surface, a through hole extending from said top surface to said bottom surface, and a first electrode formed integral with and downwardly extending from said bottom surface;
    a second electrode inserted through said through hole, said second electrode having a top end suspending above the top surface of said metal base and a bottom end suspending below the bottom surface of said metal base;
    an electrically insulative sleeve sleeved onto said second electrode and mounted in said through hole to isolate said second electrode from said metal base;
    at least one light emitting diode (LED) chip mounted on the top surface of said metal base and electrically contacting with said top surface of said metal base, said at least one LED chip electrically connected to the top end of said second electrode by at least one gold wire; and
    an electrically insulative packaging shell surrounding said metal base and said at least one LED chip, excluding a bottom end of said first electrode and the bottom end of said second electrode.

2. The High Intensity LED as claimed in claim 1, wherein said metal base is stamped by a punch machine, and is formed integrally from a copper block.

3. The High Intensity LED as claimed in claim 1, wherein said metal base further comprising a top flange upwardly extending around a periphery of said top surface.

4. The High Intensity LED as claimed in claim 3, wherein said top flange is a tapered flange sloping upwardly outwards.

* * * * *